United States Patent
Li et al.

(10) Patent No.: US 7,924,625 B2
(45) Date of Patent: Apr. 12, 2011

(54) SEGMENTED BITSCAN FOR VERIFICATION OF PROGRAMMING

(75) Inventors: Yan Li, Milpitas, CA (US); Teruhiko Kamei, Kanagawa (JP); Jeffrey W. Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/755,610

(22) Filed: Apr. 7, 2010

(65) Prior Publication Data

US 2010/0195405 A1    Aug. 5, 2010

Related U.S. Application Data

(62) Division of application No. 12/431,573, filed on Apr. 28, 2009, now Pat. No. 7,724,580, which is a division of application No. 11/563,585, filed on Nov. 27, 2006, now Pat. No. 7,545,681.

(51) Int. Cl.
*G11C 16/04* (2006.01)

(52) U.S. Cl. ............... 365/185.22; 365/185.05

(58) Field of Classification Search ............. 365/185.22, 365/185.05, 185.24
See application file for complete search history.

(56) References Cited

U.S. PATENT DOCUMENTS

| | | | |
|---|---|---|---|
| 4,967,415 A | 10/1990 | Tanagawa | |
| 5,043,940 A | 8/1991 | Harari | |
| 5,052,002 A | 9/1991 | Tanagawa | |
| 5,153,723 A | 10/1992 | Citta | |
| 5,218,569 A | 6/1993 | Banks | |
| 5,262,342 A | 11/1993 | Toyama | |
| 5,450,424 A | 9/1995 | Okugaki | |
| 5,687,114 A | 11/1997 | Khan | |
| 5,694,406 A | 12/1997 | Lipovski | |
| 5,754,567 A | 5/1998 | Norman | |
| 5,862,081 A | 1/1999 | Harari | |
| 5,898,606 A | 4/1999 | Kobayashi | |
| 6,360,347 B1 | 3/2002 | Walters, Jr. | |
| 6,438,726 B1 | 8/2002 | Walters, Jr. | |
| 6,498,749 B1 | 12/2002 | Cuppens | |
| 6,510,537 B1 | 1/2003 | Lee | |
| 6,601,211 B1 | 7/2003 | Norman | |
| 6,678,192 B2 | 1/2004 | Gongwer | |
| 6,751,766 B2 | 6/2004 | Guterman | |
| 7,440,319 B2 | 10/2008 | Li | |

(Continued)

FOREIGN PATENT DOCUMENTS

WO    2008005735    1/2008

(Continued)

OTHER PUBLICATIONS

International Search Report dated May 9, 2008, PCT Appl. No. PCT/US2007/084872, filed Nov. 15, 2007.

(Continued)

*Primary Examiner* — Vu A Le
(74) *Attorney, Agent, or Firm* — Vierra Magen Marcus & DeNiro LLP

(57) ABSTRACT

A set non-volatile storage elements are subjected to a programming process in order to store a set of data. During the programming process, one or more verification operations are performed to determine whether the non-volatile storage elements have reached their target condition to store the appropriate data. Decisions about whether to continue programming or whether the programming is successful are made based on whether overlapping groups of the non-volatile storage elements have less than a threshold number of non-volatile storage elements that are not properly programmed.

6 Claims, 14 Drawing Sheets

U.S. PATENT DOCUMENTS

| | | |
|---|---|---|
| 7,545,681 B2 | 6/2009 | Li |
| 2003/0046631 A1 | 3/2003 | Gappisch |
| 2003/0154437 A1 | 8/2003 | Chih |
| 2003/0217323 A1 | 11/2003 | Guterman |
| 2004/0015771 A1 | 1/2004 | Lasser |
| 2004/0022087 A1 | 2/2004 | Satori |
| 2004/0083333 A1 | 4/2004 | Chang |
| 2004/0257888 A1 | 12/2004 | Noguchi |
| 2005/0125708 A1 | 6/2005 | Simon |
| 2005/0268208 A1 | 12/2005 | Simizume |
| 2006/0133141 A1 | 6/2006 | Gorobets |
| 2009/0207661 A1 | 8/2009 | Li |

FOREIGN PATENT DOCUMENTS

| | | |
|---|---|---|
| WO | 2008067185 | 6/2008 |

OTHER PUBLICATIONS

Written Opinion of the International Searching Authority dated May 9, 2008, PCT Appl. No. PCT/US2007/084872, filed Nov. 15, 2007.

International Preliminary Report dated Jun. 3, 2009, PCT Appl. No. PCT/US2007/084872, filed Nov. 15, 2007.

European Office Action dated Jul. 22, 2009, European Patent Appl. 07864477.0.

Response to European Office Action dated Jul. 22, 2009, European Patent Appl. 07864477.0.

Office Action dated Nov. 24, 2008, U.S. Appl. No. 11/563,585, filed Nov. 27, 2006.

Response to Office Action dated Dec. 10, 2008, U.S. Appl. No. 11/563,585, filed Nov. 27, 2006.

Notice of Allowance dated Jan. 29, 2009, U.S. Appl. No. 11/563,585, filed Nov. 27, 2006.

Office Action dated Dec. 12, 2007, U.S. Appl. No. 11/563,590, filed Nov. 27, 2006.

Response to Office Action dated Apr. 3, 2008, U.S. Appl. No. 11/563,590, filed Nov. 27, 2006.

Notice of Allowance dated Jul. 21, 2008, U.S. Appl. No. 11/563,590, filed Nov. 27, 2006.

Notice of Allowance dated Nov. 2, 2009, U.S. Appl. No. 12/431,573, filed Apr. 28, 2009.

Korean Office Action dated Dec. 8, 2010, Korean Patent Application No. 10-2009-7013318.

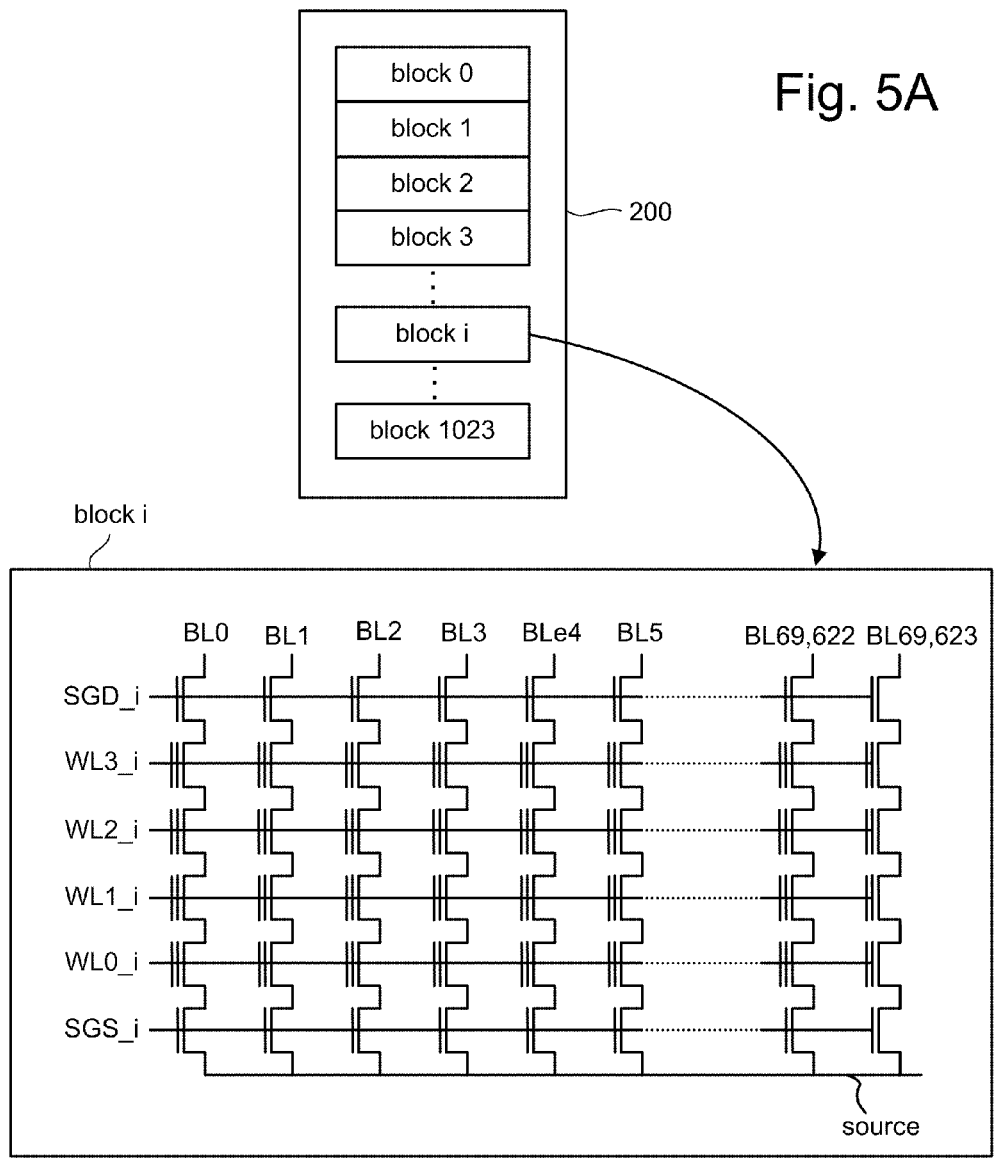
Fig. 5A
Fig. 5B
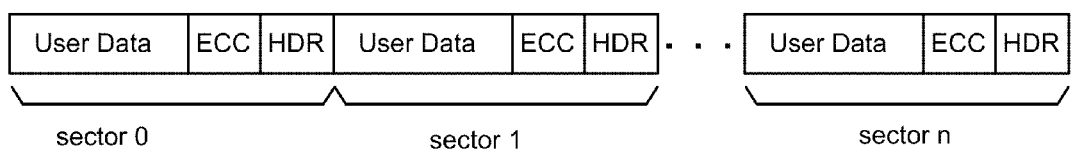

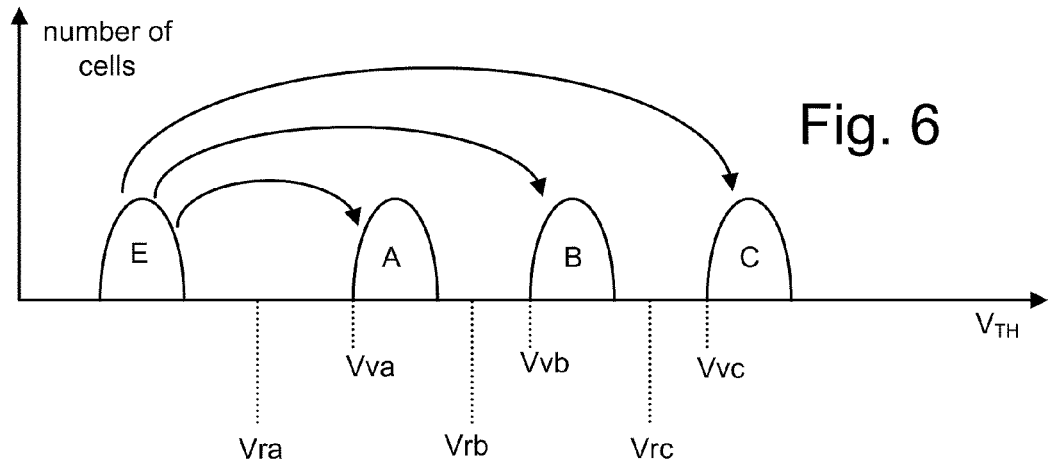
Fig. 6
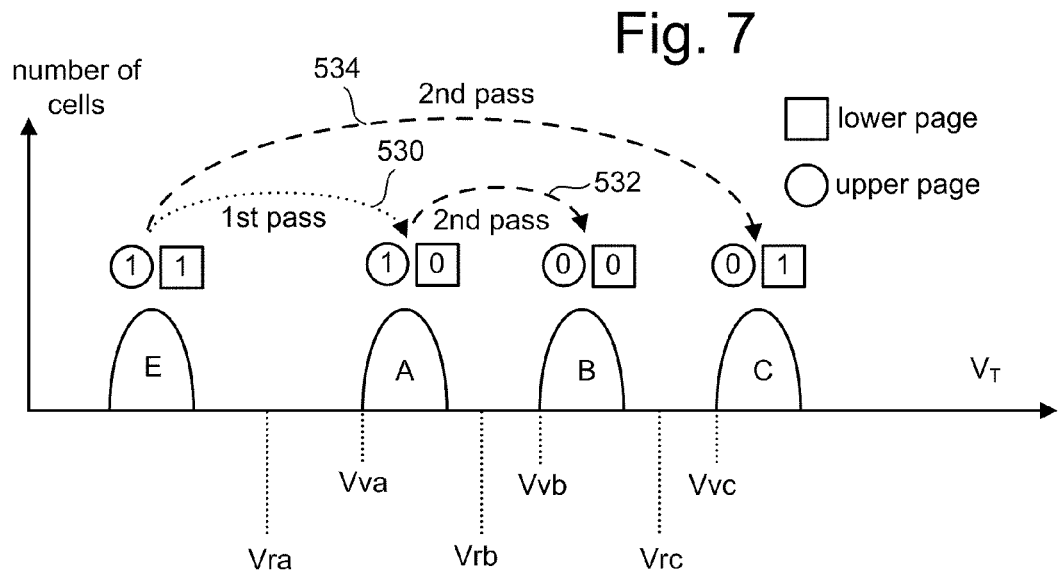
Fig. 7
| Wordline | Upper/Lower Page | All Bit Lines |
|---|---|---|
| WL3 | upper | Page 7 |
| | lower | Page 5 |
| WL2 | upper | Page 6 |
| | lower | Page 3 |
| WL1 | upper | Page 4 |
| | lower | Page 1 |
| WL0 | upper | Page 2 |
| | lower | Page 0 |
Fig. 9

Fig. 12

| Sector | Start | End |
|---|---|---|
| sector 0 | 0 | 537 |
| sector 1 | 538 | 1075 |
| sector 2 | 1076 | 1613 |
| sector 3 | 1614 | 2151 |
| sector 4 | 2152 | 2689 |
| sector 5 | 2690 | 3227 |
| sector 6 | 3228 | 3765 |
| sector 7 | 3766 | 4303 |
| sector 8 | 4304 | 4841 |
| sector 9 | 4842 | 5379 |
| sector 10 | 5380 | 5917 |
| sector 11 | 5918 | 6455 |
| sector 12 | 6456 | 6993 |
| sector 13 | 6994 | 7531 |
| sector 14 | 7532 | 8069 |
| sector 15 | 8070 | 8607 |

Fig. 13

| Zone | Start | End |
|---|---|---|
| zone 0 | 0 | 1023 |
| zone 1 | 512 | 1535 |
| zone 2 | 1024 | 2047 |
| zone 3 | 1536 | 2559 |
| zone 4 | 2048 | 3071 |
| zone 5 | 2560 | 3583 |
| zone 6 | 3072 | 4095 |
| zone 7 | 3584 | 4607 |
| zone 8 | 4096 | 5119 |
| zone 9 | 4608 | 5631 |
| zone 10 | 5120 | 6143 |
| zone 11 | 5632 | 6655 |
| zone 12 | 6144 | 7167 |
| zone 13 | 6656 | 7679 |
| zone 14 | 7168 | 8191 |
| zone 15 | 7680 | 8703 |

US 7,924,625 B2

SEGMENTED BITSCAN FOR VERIFICATION OF PROGRAMMING

CLAIM OF PRIORITY

This application is a divisional application of U.S. patent application Ser. No. 12/431,573, "SEGMENTED BITSCAN FOR VERIFICATION OF PROGRAMMING," filed on Apr. 28, 2009, by Yan Li, et al., published ON Aug. 20, 2009 as U.S. Publication No. US-2009-0207661, which is a divisional application of U.S. patent application Ser. No. 11/563,585, "SEGEMENTED BITSCAN FOR VERIFICATION OF PROGRAMMING," filed on Nov. 27, 2006, by Yan Li, et al., ISSUED AS U.S. Pat. No. 7,545,681, both of which are incorporated herein by reference.

CROSS-REFERENCE TO RELATED APPLICATIONS

The following application is cross-referenced and incorporated by reference herein in its entirety: U.S. Pat. No. 7,440,319, entitled "Apparatus With Segmented Bitscan For Verification Of Programming," by Yan Li, et al.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Many types of EEPROM and flash memories utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain) select gate 120 and a second (or source) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers. The word lines (WL3, WL2, WL1 and WL0) comprise the rows of the memory array.

Each memory cell can store data (analog or digital). When storing one bit of digital data (referred to as a binary memory cell), the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information is stored (three bits of data), there will be eight threshold voltage ranges assigned to the data values "000", "001", "010", "011" "100", "101", "110" and "111". The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; U.S. Pat. Publication No. US2003/0002348; and U.S. Pat. Publication No. 2006/0140011. The discussion herein can also apply to other types of flash memory in addition to NAND as well as other types of non-volatile memory.

When programming a flash memory cell, a program voltage is applied to the control gate and the bit line is grounded. Due to the voltage differential between the channel of the flash memory cell and the floating gate, electrons from the channel area under the floating gate are injected into the floating gate. When electrons accumulate in the floating gate, the floating gate becomes negatively charged and the threshold voltage of the memory cell is raised.

In some implementations, the programming voltage is applied as a series of voltage pulses. Each programming pulse is followed by one or more verify operations to determine if the memory cells has been programmed to the desired state.

Modern flash memory devices, particularly those of the NAND architecture and involving multi-state memory cells, are arranged in blocks and pages. A block refers to a unit of erase, and defines a group of memory cells that are simultaneously erased in a single erase operation. Typically, a block of memory cells is the smallest group of memory cells that can be erased. A page refers to a unit of programming, and defines a group of data bits (could be memory cells) that are simultaneously programmed. Each block typically includes multiple pages. Generally, the arrangement of memory cells into pages and blocks is based on the physical realization of the memory array. For example, in many NAND memory arrays, a page of memory cells is defined by those cells that share the same word line, and a block is defined by those pages residing in the same NAND string. For example, if a NAND string includes thirty-two memory cells in series, a block will typically include thirty-two pages, or an integer multiple of thirty-two pages. In some NAND memory arrays one word line can be shared by memory cells for two pages; the data for a first page is stored in the memory cells of even-numbered columns, while the data for a second page is stored in the memory cells of odd-numbered columns along that word line. Other arrangements are also possible.

In some memory systems utilizing multi-state memory cells, each bit of data in a memory cell is in a different page. For example, if an array of memory cells store three bits of data (eight states or levels of data) per memory cell, each memory cell stores data on three pages with each of the three bits being on a different page. Thus, within a block in this example, each word line is associated with three pages or an integer multiple of three pages. Other arrangements are also possible.

Historically, the organization of data stored in a flash memory has followed the file systems used in connection with magnetic disk storage, which stores data in sectors. A sector is typically a group of data of a fixed size, for example, 512 bytes of user data plus some number of bytes of overhead. In many modern file systems, the operating system of the computer or other host system arranges data into sectors, and writes data to and reads data from non-volatile storage on a sector-by-sector basis. To permit convenient use of flash memory devices in such systems and applications, many modern flash memories handle data in a similar fashion, mapping logical sector addresses to physical addresses in the flash memory array.

In recent years, the sizes and capacities of flash memory devices have greatly increased, resulting in memory arrays of more than 4 billion cells. In such arrays, a single word line may extend to over tens of thousands of memory cells. In such large scale flash memories, each page includes multiple sectors. As such, the units of data handled by the host system (i.e., "sectors") are smaller than the smallest programming unit in the flash memory device. Typically, however, the multiple sectors of data that comprise a page of the flash memory will be sequentially communicated to the flash memory, and will be simultaneously programmed into a page of the flash memory in a single operation.

By way of further background, the use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" (or original data) data bits being encoded. For example, the storage of error correction coded data in a memory resource involves the encoding of one or more code words that include the actual data and the additional code bits, using a selected code. Retrieval of the stored data involves the decoding of the stored code words according to the same code as used to encode the stored code words. Because the code bits "over-specify" the actual data portion of the code words, some number of error bits can be tolerated, without any loss of actual data evident after decoding.

Many ECC coding schemes are well known in the art. These conventional error correction codes are especially useful in large scale memories, including flash (and other non-volatile) memories, because of the substantial impact on manufacturing yield and device reliability that such coding schemes can provide, allowing devices that have a few non-programmable or defective cells to be useable. Of course, a tradeoff exists between the yield savings and the cost of providing additional memory cells to store the code bits (i.e., the code "rate"). Some ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Typically, the error correction codes used in connection with flash memory storage are systematic, in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

By way of further background, the programming and erasing of conventional flash memory devices may involve the verification of the state of the memory cells being programmed or erased to ensure that the desired state has been reached for each of the cells subject to the operation. Indeed, considering that the programming and erasing of flash memory cells are typically performed by the application of a sequence of pulses of the appropriate voltages, and also considering that the pulse sequences consume substantial time and power, many flash memories now include verification operations during the programming or erasing operations themselves. For example, the programming of a page of memory cells is typically performed by applying a programming pulse, and then verifying the programmed cells against one or more desired "verify" voltages for the data level(s) being programmed. If not all of the memory cells verify to the appropriate desired level after a first pulse, the programming pulse is repeated (often at a higher voltage), and the cells are verified again. Upon all of the memory cells reaching the desired program level, the programming operation is terminated.

Verification is also typically performed in the erasing of a block of flash memory cells, with additional erase pulses applied as necessary to ensure all cells are erased. In general, for NAND flash memories, erase verification is typically performed by applying a selected control gate voltage to all of the word lines of the block being erased, to determine whether any of the cells conduct at that control gate voltage. Because the threshold voltages of erased cells are typically below 0 volts, and because the application of negative word line voltages is not desirable, the verifying of negative erase voltages is often done by way of a low or zero voltage on the word lines, with the common source lines biased to effectively place a negative gate-to-source voltage at each memory cell in the NAND chain. A similar approach is used during "soft" programming, which refers to the conventional operation of slightly programming erased flash memory cells, to prevent some or all of the cells from being too deeply erased.

A typical way of verifying programming is to test the conduction of each cell at a specific compare point that is set by a control gate voltage. Those cells that have previously been verified as sufficiently programmed are locked out, for example, by raising the bit line voltage for those cells in the page being programmed to a high level (e.g., the voltage of the $V_{dd}$ power supply), to stop the programming process for those cells. Those cells that are not yet sufficiently programmed receive the next higher voltage pulse in the programming sequence, followed by another verify operation.

As is well known in this art, some memory cells are slower to program or erase than others, because of manufacturing variations among those cells, because those cells were previously erased to a lower threshold voltage than others, because of uneven wear among the cells within a page, or the like. And, of course, some cells cannot be programmed or erased whatsoever, because of a defect or other reason. As mentioned above, error correction coding provides the capability of tolerating some number of slow or failed cells, while still maintaining the memory usable. In some applications, a page of data is programmed by repeatedly applying programming pulses until all memory cells on that page verify to the desired programmed state. In these applications, programming terminates if a maximum number of programming pulses is reached prior to successful verifying of the programmed page, following which the number of cells that have not yet been verified to the desired state is compared with a threshold value, which depends on the capability of the error correction coding that will be used in the reading of data from that page. In other applications in which the error correction is sufficiently robust, programming and erasing time is saved by terminating the sequence of programming or erasing pulses upon the number of slow (or error) cells that are not yet fully programmed or erased being fewer than the number of bits that are correctable.

Error correction is typically performed on a sector-by-sector basis. Thus, each sector will have its own set of ECC codes. This error correction is convenient and useful because the sector is the desired unit of data transfer to and from the host system.

The usual maximum number of bits correctable within a sector of 512 bytes, using a BCH or Reed-Solomon code is four. Therefore, if a programming process results in two errors, the process can be considered successful because those two errors can be correct during a subsequent read process using ECC. In a page that stores 8 sectors, error correction should be able to tolerate 32 error bits (4 bits/sector×8 sectors). However, in conventional circuitry, the verification process counts errors (bits that have not properly programmed) across the entire page, regardless of the position of the error bit. Because it is possible that all error bits are within the same sector, the maximum number of error bits that can ignored during programming (or erase) verification over a page must be kept below the maximum number of allowed bits to ignore for a sector. Typically, in many memory systems, the maximum number of bits that can be ignored is even lower to ensure that some error correction remains to correct other errors found during the read process. Consider the example, where one bit has failed in each of eight sectors in a page. The typical system described above will not conclude that programming was successful, despite the ability of ECC to correct one error per sector.

SUMMARY OF THE INVENTION

A new system is proposed that allows for more error bits to be tolerated in a non-volatile memory system. The bits of data in a page are grouped into a set of overlapping zones. In one embodiment, zones are bigger than a sector and each zone may span two or more sectors. However, other sized zones can be used and, in other embodiments, zones can be smaller than a sector. Because the zones are overlapping, a sector is likely to be in two or more zones. During verification performed as part of programming (or erasing), a determination is made for each zone of whether the number of error bits in that zone are less than the maximum number of bits correctable for a sector. This scheme allows for more error bits to be tolerated.

One embodiment includes subjecting a set non-volatile storage elements to programming as part of a programming process, where the set of non-volatile storage elements includes overlapping groups of non-volatile storage elements. Each group is tested to determine whether it has less than a threshold number of non-volatile storage elements that are not properly programmed. A programming process proceeds (e.g., continued/not continued or concludes as successful/unsuccessful) based on whether each group has less than the threshold number of non-volatile storage elements that are not properly programmed. In one example implementation, the testing of each group includes determining a first number of redundant non-volatile storage elements that have not been properly programmed, determining a second number of original data non-volatile storage elements for a particular group that have not been properly programmed and comparing a sum of the first number and the second number to the threshold number.

One embodiment includes a plurality of non-volatile storage elements, one or more voltage generating circuits in communication with the non-volatile storage elements, a plurality of sensing circuits in communication with the non-volatile storage elements, a plurality of data processing circuits in communication with the sensing circuits, and a control circuit in communication with the one or more voltage generating circuits and the data processing circuits. The one or more voltage generating circuits provide verification voltages to the plurality of non-volatile storage elements. The sensing circuits sense conditions of the non-volatile storage elements. The data processing circuits provide an indication to the control circuit as to whether the non-volatile storage elements have been properly programmed. The control circuit determines whether overlapping groups of the non-volatile storage elements each have less than a threshold number of non-volatile storage elements that are not properly programmed.

BRIEF DESCRIPTION OF THE DRAWINGS

FIG. 5A is a block diagram depicting one embodiment of a memory array.

FIG. 5B depicts a page of data.

FIG. 6 depicts an example set of threshold voltage distributions and describes a process for programming non-volatile memory.

FIG. 7 depicts an example set of threshold voltage distributions and describes a process for programming non-volatile memory.

FIGS. 9 is a table depicting the order of programming non-volatile memory in one embodiment.

FIG. 12 is a table that depicts an example of ranges for a set of sectors.

FIG. 13 is a table that depicts an example of ranges for a set of overlapping zones.

DETAILED DESCRIPTION

One example of a memory system suitable for implementing the present invention uses the NAND flash memory structure. However, other types of non-volatile storage devices can also be used. For example, a so called TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 1:
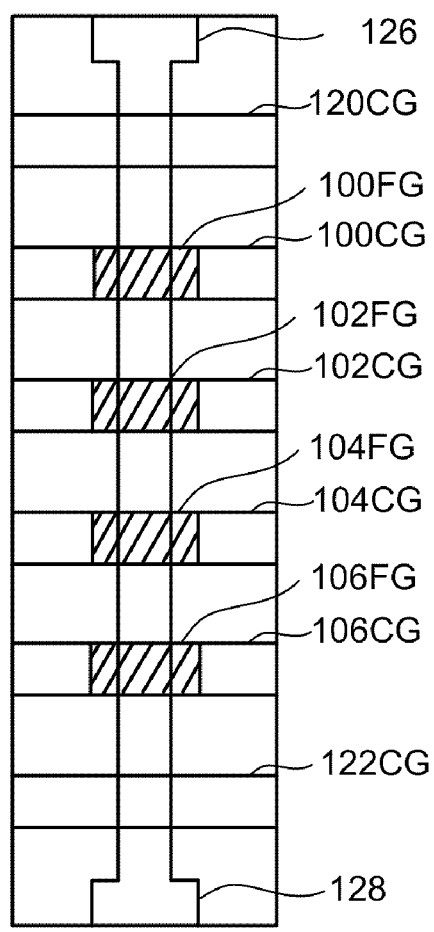
FIG. 1 is a top view of a NAND string.
Figure 2:
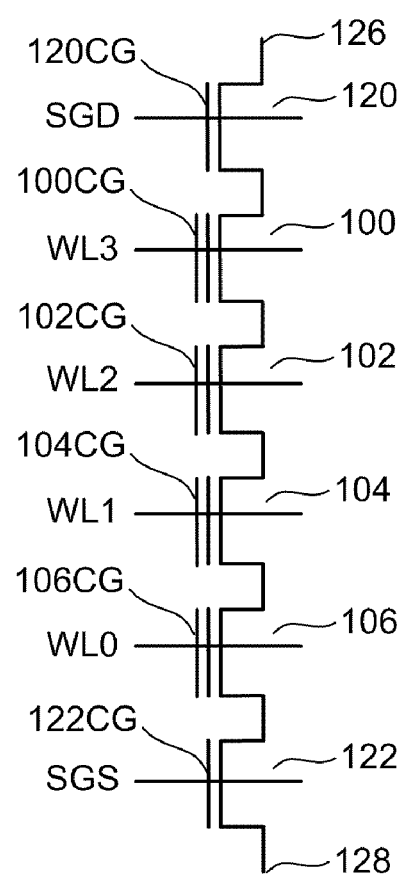
FIG. 2 is an equivalent circuit diagram of the NAND string.
Figure 3:
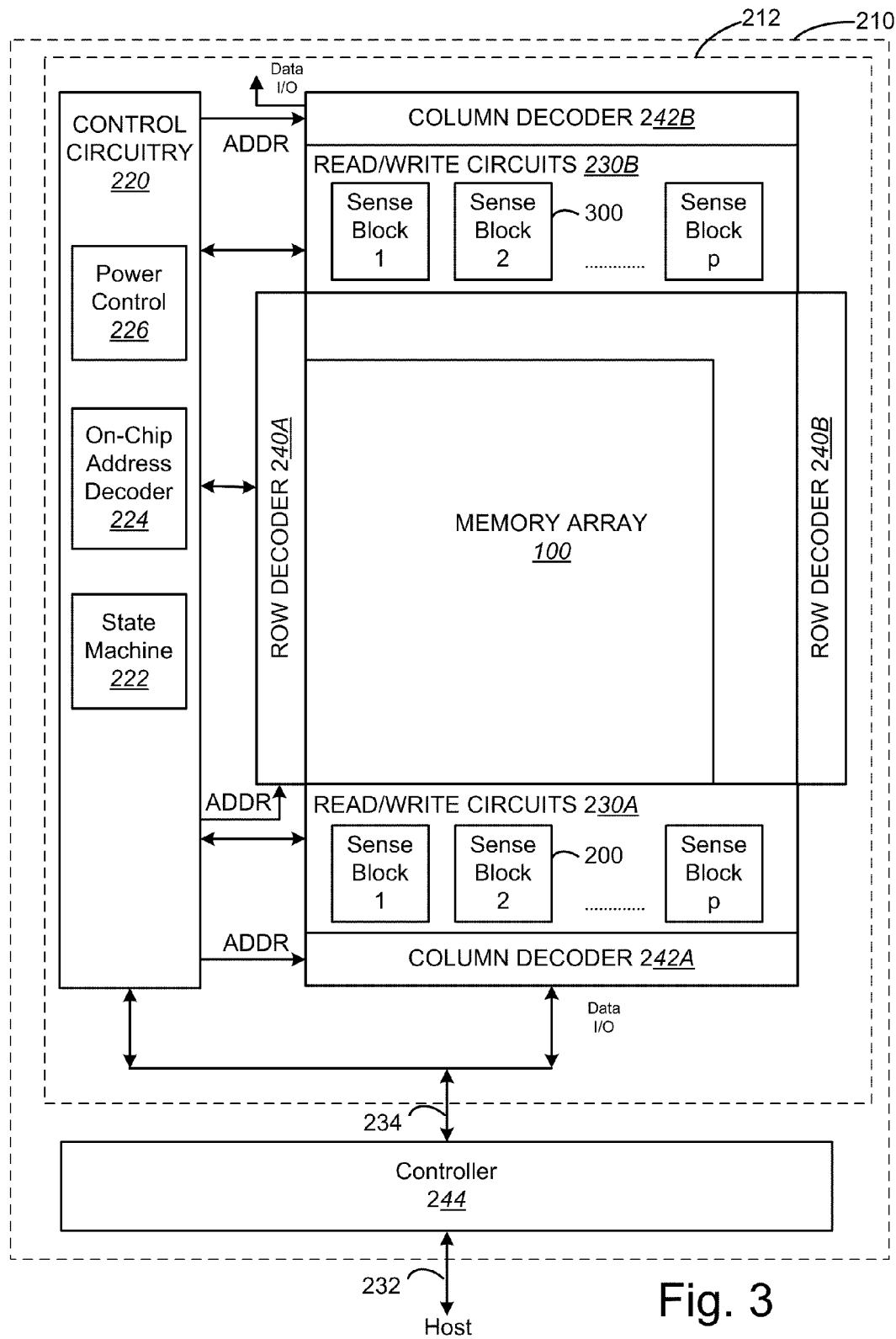
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

Figure 4:
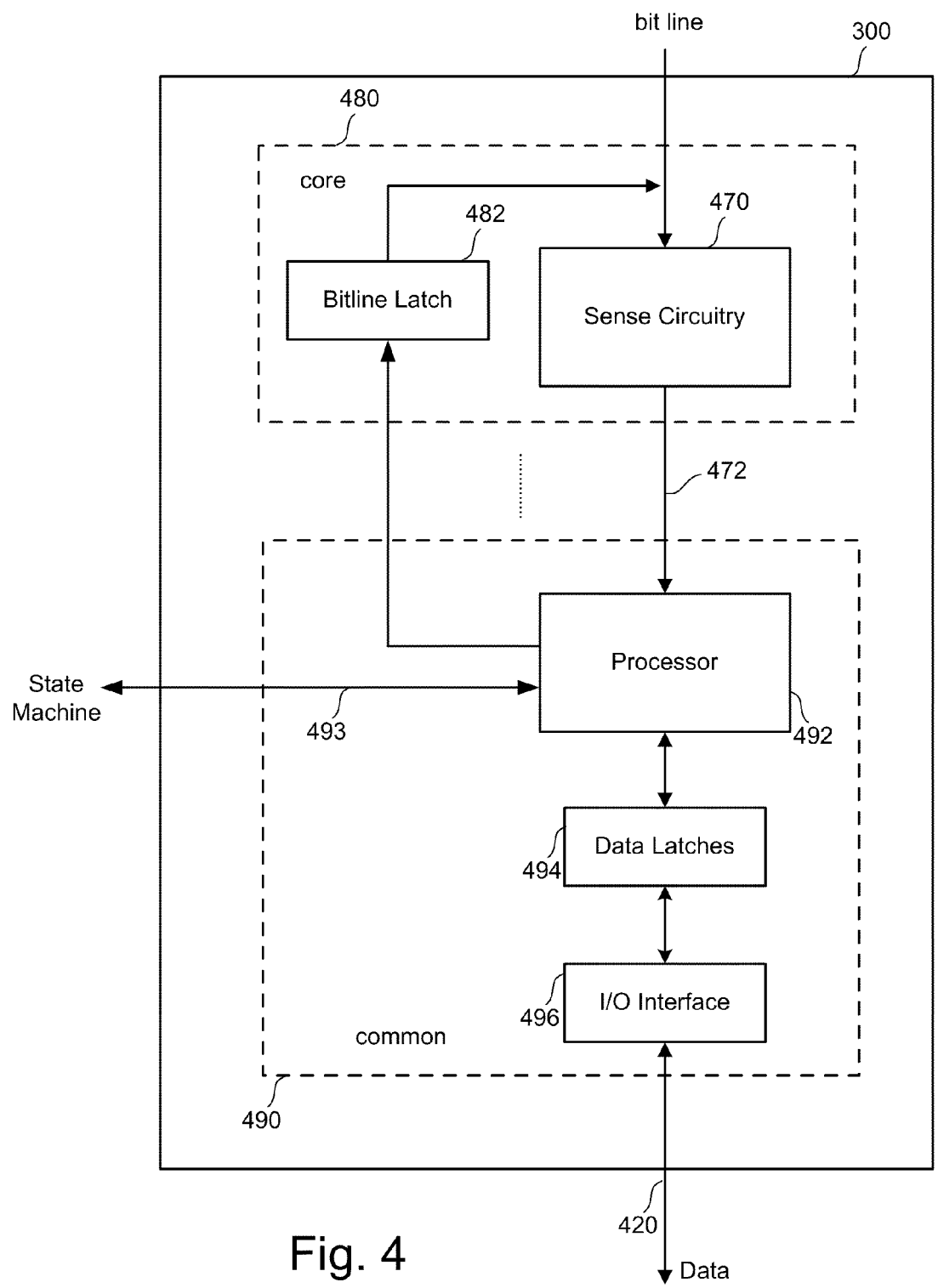
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in come embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. patent application Ser. No. 11/099,133, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

FIG. 5A depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages.

FIG. 5B depicts the original data for a page. Depending on the size of the page, the page contains many sectors. Each sector includes user data, error correction codes (ECC), and header information.

As one example, a NAND flash EEPROM is depicted in FIG. 5A that is partitioned into 1,024 blocks. In each block, in this example, there are 69,623 columns corresponding to bit lines BL0, BL1, ... BL69,623. In one embodiment, all the bit lines of a block can be simultaneously selected during read and program operations. Memory cells along a common word line and connected to any bit line can be programmed at the same time.

In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5A shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions for the memory cell array when each memory cell stores two bits of data. Other embodiment, however, may use more or less than two bits of data per memory cell (e.g., such as three bits of data per memory cell). FIG. 6 shows a first threshold voltage distribution E for erased memory cells. Three threshold voltage distributions, A, B and C for programmed memory cells, are also depicted. In one embodiment, the threshold voltages in the E distribution are negative and the threshold voltages in the A, B and C distributions are positive.

Figure 11:
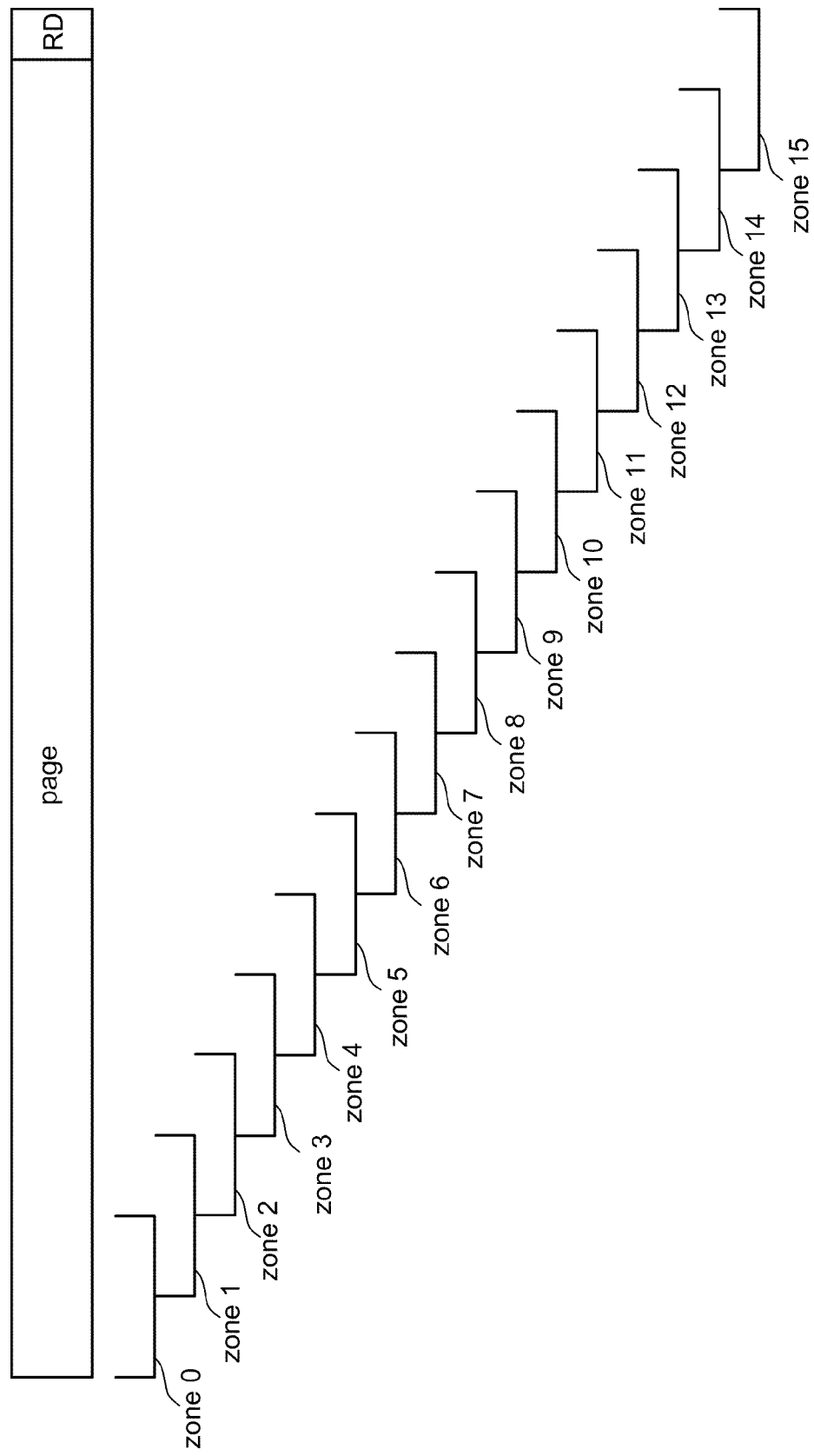
FIG. 11 depicts a page of data and redundant data grouped into zones.

Each distinct threshold voltage range of FIG. 6 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 11 shows four states, the present invention can also be used with other multi-state structures including those that include more or less than four states.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in.

FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erased state E directly to any of the programmed states A, B or C. For example, a population of memory cells to be programmed may first be erased so that all memory cells in the population are in erased state E. While some memory cells are being programmed from state E to state A, other memory cells are being programmed from state E to state B and/or from state E to state C. Full sequence programming is graphically depicted by the three curved arrows of FIG. 6.

FIG. 7 illustrates an example of a two-pass technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be state A, as shown by arrow 530.

In a second programming pass, the cell's threshold voltage level is set according to the bit being programmed into the upper logical page. If the upper logical page bit is to store a logic "1," then no programming occurs since the cell is in one of the states E or A, depending upon the programming of the lower page bit, both of which carry an upper page bit of "1." If the upper page bit is to be a logic "0," then the threshold voltage is shifted. If the first pass resulted in the cell remaining in the erased state E, then in the second phase the cell is programmed so that the threshold voltage is increased to be within state C, as depicted by arrow 534. If the cell had been programmed into state A as a result of the first programming pass, then the memory cell is further programmed in the second pass so that the threshold voltage is increased to be within state B, as depicted by arrow 532. The result of the second pass is to program the cell into the state designated to store a logic "0" for the upper page without changing the data for the lower page.

In one embodiment, a system can be set up to perform full sequence writing if enough data is written to fill up a word line. If not enough data is being written, then the programming process can program the lower page with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application titled "Pipelined Programming of Non-Volatile Memories Using Early Data," Pub. No. 2006/0126390, Ser. No. 11/013,125, filed on Dec. 14, 2004, inventors Sergy Anatolievich Gorobets and Yan Li, incorporated herein by reference in its entirety.

Figure 8A:
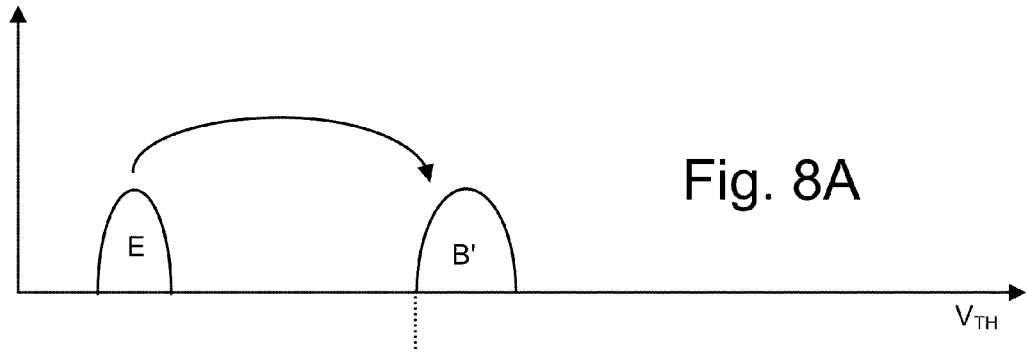
FIGS. 8A-C show various threshold voltage distributions and describe a process for programming non-volatile memory.
Figure 8B:
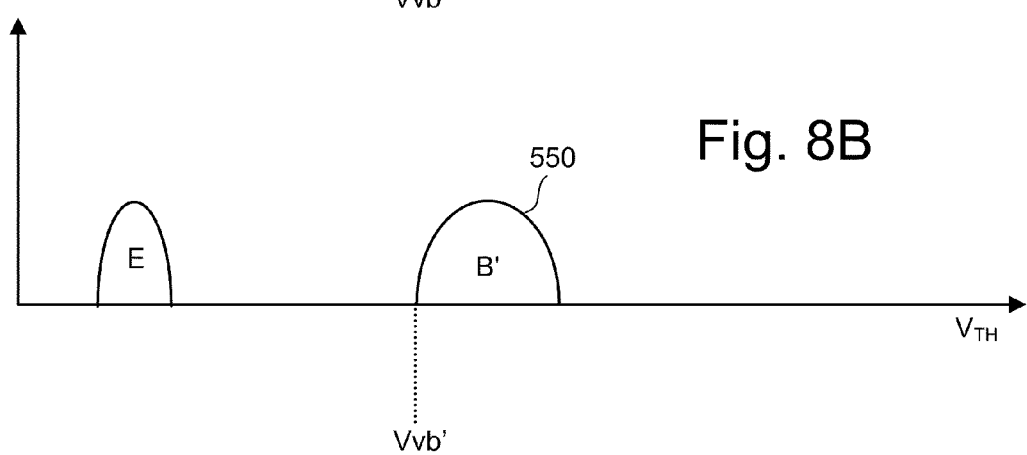
Figure 8C:
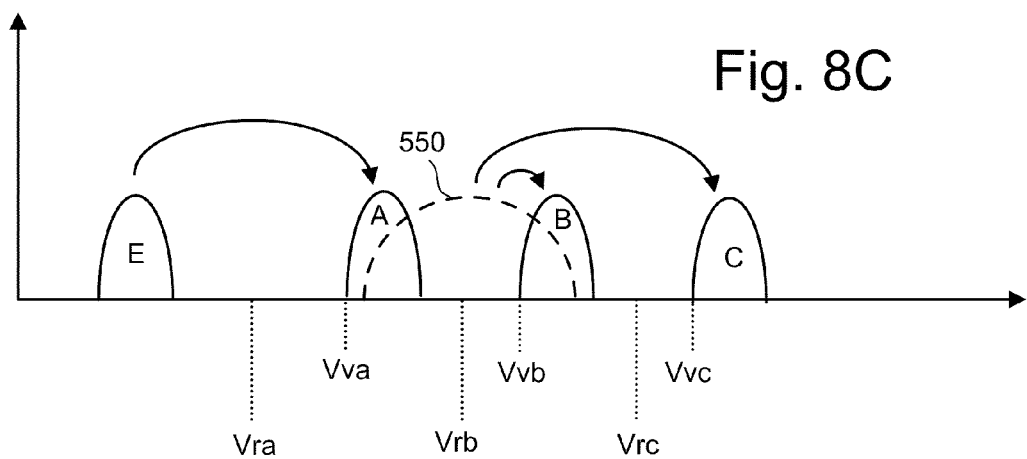

FIGS. 8A-C disclose another process for programming non-volatile memory that reduces the effect of floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0.

The programming process of FIGS. 8A-C is a two-step process. In the first step, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb.

In one embodiment, after a memory cell is programmed from state E to state B', its neighbor memory cell (WLn+1) in the NAND string will then be programmed with respect to its lower page. For example, after the lower page for a memory cell connected to WL0 is programmed, the lower page for a memory cell (the neighbor memory cell) on the same NAND string but connected to WL1 would be programmed. After programming the neighbor memory cell, the floating gate to floating gate coupling effect will raise the apparent threshold voltage of earlier memory cell to be programmed if that earlier memory cell had a threshold voltage raised from state E to state B'. This will have the effect of widening the threshold voltage distribution for state B', as depicted in FIG. 12B. This apparent widening of the threshold voltage distribution will be remedied when programming the upper page.

FIG. 8C depicts the process of programming the upper page. If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 550 and the upper page data is to remain at 1, then the memory cell will be programmed to final state B. If the memory cell is in intermediate threshold voltage distribution 550 and the upper page data is to become data 0, then the threshold voltage of the memory cell will be raised so that the memory cell is in state C. The process depicted by FIGS. 8A-C reduces the effect of coupling between floating gates because only the upper page programming of neighbor memory cells will have an effect on the apparent threshold voltage of a given memory cell.

Although FIGS. 8A-C provide an example with respect to four data states and two pages of data, the concepts taught by FIGS. 8A-C can be applied to other implementations with more or less than four states, different than two pages, and/or other data encodings. For example, the present invention can be used with memory cells that store three bits of data; use eight data states; and program based on the processes of FIG. 6, FIG. 7 or FIGS. 8A-8C.

FIG. 9 is a table that describes one embodiment of the order for programming memory cells utilizing the programming method of FIGS. 12A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 7. Memory cells are programmed according to page number, from page 0 to page 7. In other embodiments, other orders of programming can also be used.

Figure 10:
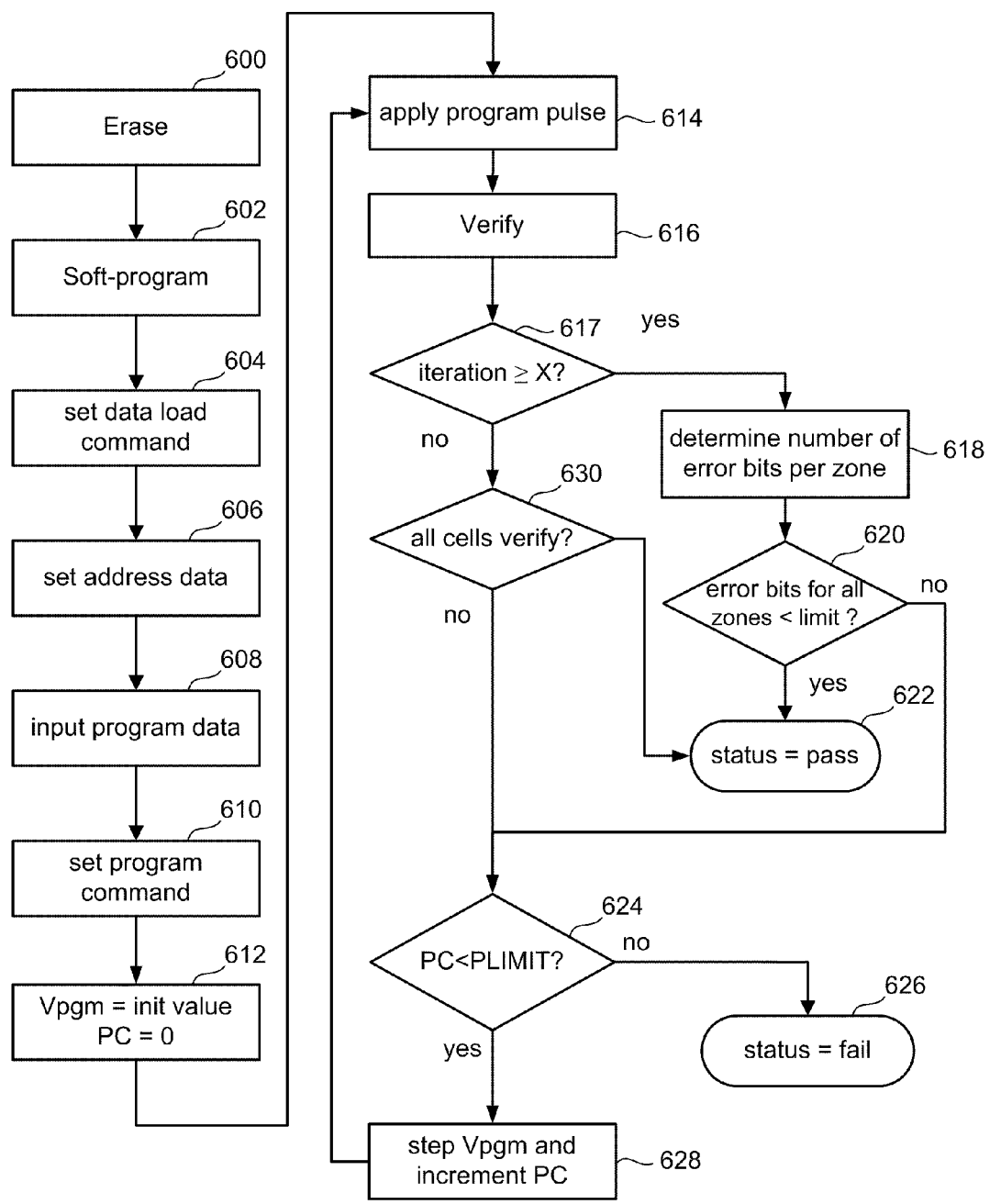
FIG. 10 is a flow chart describing one embodiment of a process for programming non-volatile memory.

FIG. 10 is a flow chart describing a programming process for programming memory cells connected to a selected word line. Thus, the process of FIG. 10 is used to implement the full sequence programming of FIG. 6, one pass (either the first pass or the second pass) of the two pass programming technique of FIG. 7, or one pass (either the first pass or the second pass) of the two step programming technique of FIGS. 8A-C. In one embodiment, the process of FIG. 10 is performed by and/or at the direction of control circuitry 220. The process of FIG. 10 can also be performed as one pass of a three pass programming technique for three pages of data (e.g., three bits of data per memory cell), or as one pass of another multi-pass programming technique. Many different programming techniques can be used with the present invention.

In one implementation of the process of FIG. 10, memory cells are erased (in blocks or other units) prior to programming (step 600). Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, separate blocks, or another unit of cells. After the block of memory cells is erased, the various memory cells can be programmed or partially programmed as described herein. Note that the erasing that is performed in step 600 would not need to be performed before each word line of a block is programmed. Rather, the block can be erased and then each word line can be programmed without erasing between the programming of the word lines.

At step 602, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 604, a "data load" command is issued by controller 244 and input to state machine 222. At step 606, address data designating the page address is provided to the decoder. At step 608, a page of program data for the addressed page is input for programming. That data is latched in the appropriate registers/latches for the selected bit lines. In some embodiments, the data is also latched in a second register for the selected bit lines to be used for verify operations. At step 610, a "program" command is received from controller 244 and provided to state machine 222.

Triggered by the "program" command, the data latched in step 608 will be programmed into the selected memory cells controlled by state machine 222 using the pulses applied to the appropriate word line. At step 612, Vpgm, the programming voltage signal (e.g., a series of pulses) is initialized to the starting magnitude (e.g., ~12V or another suitable level) and a program counter PC maintained by state machine 222 is initialized at 0. At step 614, a pulse of the program signal Vpgm is applied to the selected word line, which has the effect of providing the voltage pulse to the control gates of each of the memory cells connected to the selected word line. Thus, all memory cells connected to the selected word line will be subjected to programming because they are receiving the voltage pulse, even if they are inhibited from or locked out of programming. One embodiment includes boosting the unselected NAND strings during programming to prevent program disturb. Various boosting methods can be used. More information about boosting can be found in U.S. patent application Ser. No. 11/535,628, "Reducing Program Disturb In Non-Volatile Storage," filed on Sep. 27, 2006 and U.S. Pat. No. 6,859,397; both of which are incorporated herein by reference in their entirety.

At step 616, the memory cells being programmed are verified to determine whether they have reached their target levels. If the threshold voltage of a memory cell has reached the target threshold voltage level, then the memory cell has been properly programmed and can be locked out from additional programming by raising its bit line voltage (or using another method). If the threshold voltage of a memory cell has not reached the target threshold voltage level, then the memory cell has not been properly programmed (e.g., programming has not completed yet, programming is slow, there is an error, etc.) and additional programming may be performed.

In general, during verify operations and read operations, the selected word line is connected to a voltage, a level of which is specified for each read and verify operation in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

In some embodiments, the verification process includes testing whether the threshold voltages of the memory cells have reached the various target levels for each of the states. For example with respect to FIG. 6, there will be three verification operations: (1) for Vva, (2) for Vvb and (3) Vvc. For three bits of data, there can be up to seven verification operations.

After performing the verification process, it is determined whether the iteration of the loop of steps 614, 616, 617, 618, 620, 622, 624, 626, 628 and 630 is less than some threshold number chosen based on testing and performance characterization for a particular implementation. As will be discussed below, a technology proposed herein is to determine error bits for a set of overlapping zones. In one embodiment, the testing of overlapping zones does not start until after the X iterations of the loop of steps 614, 616, 617, 618, 620, 622, 624, 626, 628 and 630. One example of X is 17. Before the X iteration (determined in step 617), the verification in step 616 will be followed by a reporting of a successful completion of programming in step 622 if all selected memory cells have reached their targeted programming state (step 630). If all selected memory cells have not reached their targeted programming state (step 630), then (before the X iteration) the programming process will proceed to step 624, discussed below.

After the X iteration (tested in step 617), verification in step 616 is followed by a determination of the number of error bits per zone (step 618). An error bit is a data bit stored in a memory cell that has not been programmed properly because its threshold voltage has not reached its target level. For example, if a memory cell is supposed to be programmed to state C (see FIG. 6), then it is an error bit if the threshold voltage is less than Vvc. In prior art devices, the number of error bits is calculated for all data in a page. The current technology proposed to group the data of a page into a set of overlapping zones and to calculate the number of error bits for each zone.

FIG. 11 depicts an example of a page of data and how it is grouped into overlapping zones. Note that at the end of the page of data is a set of redundant data RD. The redundant data RD is stored in a set of redundant memory cells in the block that are connected to the same word line as the memory cells associated with the page. If original memory cells associated with the page fail due to manufacturing or other reasons, then during device test, device manufacturing or other event, redundant memory cells can be assigned to replace the failed memory cells. Therefore, bad original data bits in the page are replaced by redundant data bits. The memory array will keep track of which redundant memory cells are assigned to replace which original data memory cells. The redundancy is normally managed by columns. Some defects such as bitline short or bitline open will use the redundant columns to replace the normal columns. The random bits failures are normally not replaced by the redundancy column since all the bits on that column address will be replaced together. The limited number of redundant columns also limits the usage only in whole column defects.

FIG. 11 shows the page of data, including the redundant data RD, being grouped into sixteen overlapping zones. Zone 0 overlaps with zone 1; zone 2 overlaps with zone 1 and zone 3; zone 4 overlaps with zone 3 and zone 5, and so on. In one embodiment, each sector has 512 bytes of data and 26 bytes used for ECC/header information; there are 16 sectors in a page; and each zone is 1K. In other embodiments, other sizes and arrangements can also be used. The present invention is not limited to any particular size or arrangement. Note that the redundant data RD is part of zone 16.

FIG. 12 is a table that shows the start address and end address of sixteen sectors in one example of a page. FIG. 13 is a table that shows the start address and end address of sixteen overlapping zones in one example of a page. In this example, the zones are bigger than the sectors, each zone covers one whole sector, spans at least two sectors, and many sectors are in more than one zone. The reason for having such a zone structure is that the user sector is non-binary size which is hard (although possible) to be detected as a group. To reduce the complexity of the implementation, the zone is designed in the way that it is always covers at least one whole sector. To make sure that every user sector is covered by a zone, the 16 zones are arranged in the overlapping fashion. In some cases, the zone size can be increased to cover more than one sector. To save detection time, the zone can be divided into two halves, with each half only being scanned for errors once. Each zone can be thought of as two halves: with the first half overlapping with one neighboring zone and the second half overlapping with another neighboring zone. For example, the first half of zone 2 overlaps with zone 1 and the second half of zone 2 overlaps with zone 3. In other embodiments, other sizes and arrangements can also be used.

Looking back at FIG. 10, step 618 includes determining the number of error bits in each zone. In some embodiments, some error bits can be in more than one zone. In step 620, it is determined whether the number of error bits for each zone is less than a limit. For example, various ECC implementations have a set number of error bits that can be recovered. The limit used in step 620 should be less than that set number of error bits that can be recovered to allow for other errors noticed during the read process. If an ECC scheme allows for four error bits, then the limit in step 620 could be one or two error bits. If an ECC scheme allows for ten error bits, then the limit in step 620 could be one, two, three, four or another amount of error bits less than ten. In one example, the test in step 620 is whether every zone has less than three error bits. If so, then the programming process has completed successfully (step 622). If not, then the program counter PC is checked against a program limit value PLIMIT in step 624. One example of a program limit value is twenty; however, the program limit value could be less than twenty or more than twenty, depending on the implementation. If the program counter PC is less than the program limit value PLIMIT, then the magnitude of the Vpgm pulse is increased by the step size (e.g., 0.2-0.4 volt step size) and the program counter PC is incremented in step 628. After step 628, the process loops back to step 614 to apply the next Vpgm pulse. If the program counter PC is not less than the program limit value (step 624), then the programming process has failed (step 626).

In an alternative embodiment of FIG. 10, steps 617 and 630 will not be performed, and each iteration of the loop of steps 614, 616, 618, 620, 622, 624, 626, and 628 will include determining the number of error bits per zone (step 618) and comparing whether all zones have less error bits than the limit (step 620). That is, after step 616 the process always continues with step 618 (skipping steps 617 and 630).

Figure 14:
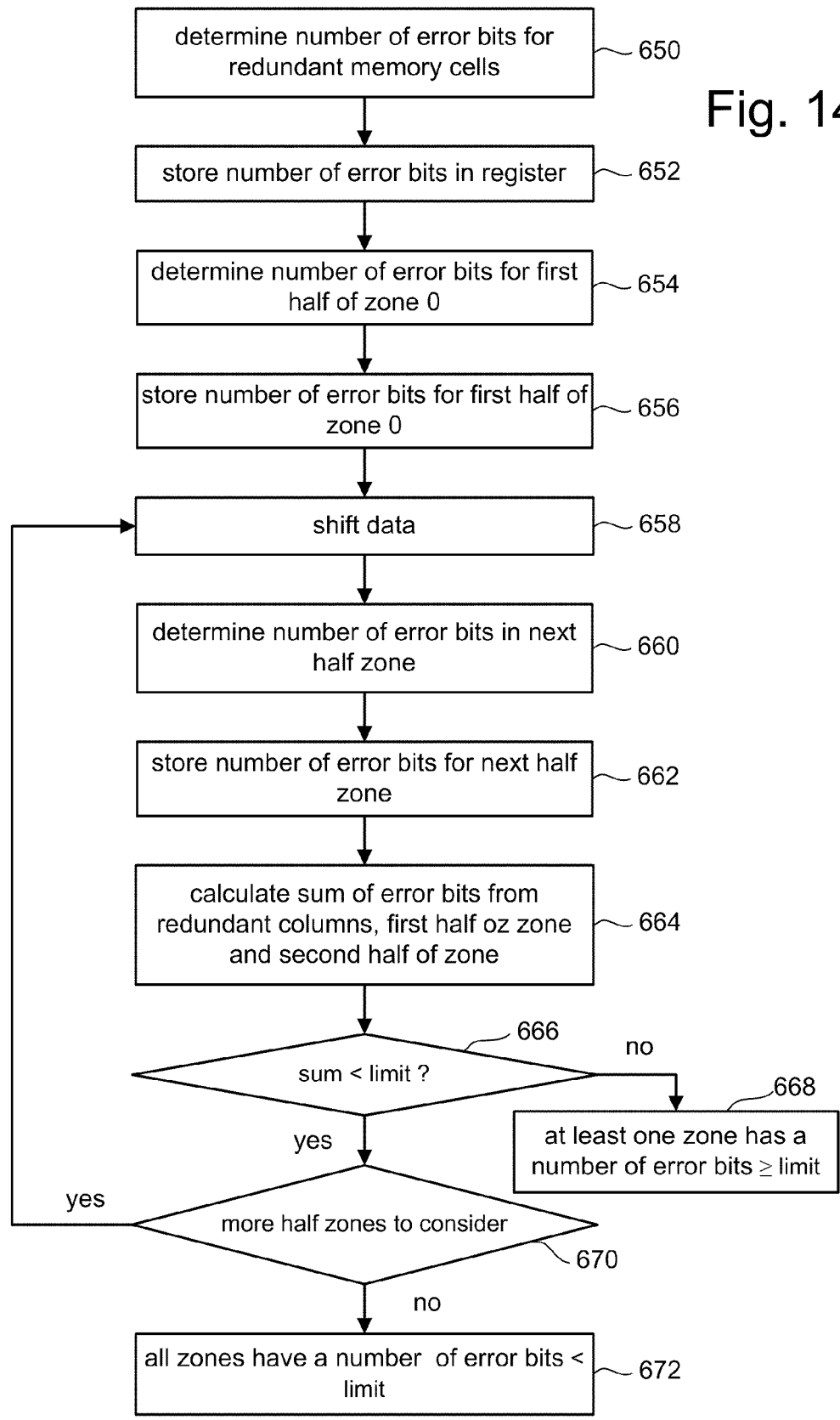
FIG. 14 is a flow chart describing one embodiment of a process for determining the number of error bits per zone.

FIG. 14 is a flow chart describing one embodiment of a process for determining the number of error bits per zone (see step 620 of FIG. 10). Note that the process of FIG. 14 is only one example implementation. Other implementations are also within the spirit of the present invention. In the flash memory structure with column redundancy, the bad columns replaced by the redundant columns need to be counted in the special way. If two bad columns in one zone are replaced by the redundant columns, then only counting the under-programmed failure bits will not be enough to cover all the errors in the user sector. Some error bits in the user sector could be in the column redundancy. Therefore, the errors in the redundant columns should be counted. But the information for the redundant columns is not easily available at the time of error detection. One solution is to count all the errors all of the redundant columns and add to each zone's error count to account for the worst case situation. In step 650 of FIG. 14, the number of error bits is determined for the redundant memory cells. In one embodiment, all error bits in the redundant memory cells are counted, regardless of which sectors a redundant memory cell is assigned to. In step 652, the number of error bits determined for the redundant memory cells is stored in a register or other storage device. In one embodiment, step 650 is performed by determining the number of error bits in the second half of zone 16 or another portion of zone 16. In other embodiments, the redundant memory cells can be in other zones.

In step 654, the number of error bits is determined for the first half of zone 0. In one embodiment, each zone is divided into a first half and a second half. For example, the first half of zone 0 starts at address 0 and ends at address 511, and the second half of zone 0 starts at address 512 and ends at address 1023. The number of error bits between address 0 and address 511 are counted in step 654 and stored in step 656.

Figure 15:
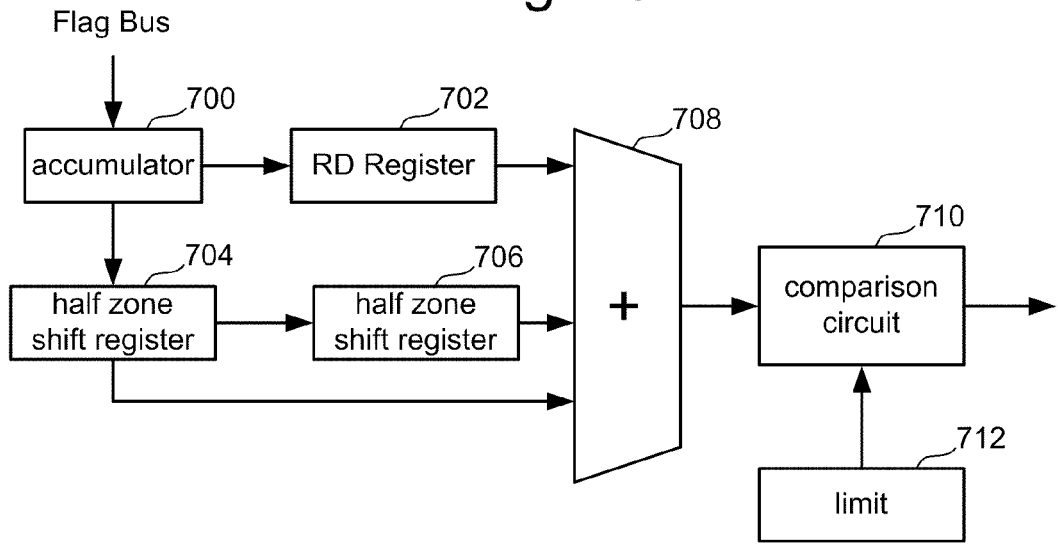
FIG. 15 is a block diagram of a circuit used to determine the number of error bits per zone.

FIG. 15 shows one embodiment of components included in state machine 222 or other portion of control circuitry 220. Accumulator 700 receives a set of one or more lines of a Flag Bus (discussed in more detail below). The Flag Bus provides an indication of error bits (as discussed below) that are accumulated by accumulator 700. Accumulator 700 is connected to RD register 702 and half zone shift register 704. Half zone shift register 704 is connected to half zone shift register 706. RD register 702, half zone shift register 704, and to half zone shift register 706 are all connected to the inputs of addition circuit 708. The output of addition circuit 708 and the output of register 712 (storing the "limit" value discussed above) are provided to comparison circuit 710.

Accumulator 700 determines the number of error bits in the redundant columns (step 650 of FIG. 14) and stores that number in RD register 702 (step 652). Accumulator 700 determines the number of error bits in the first half of zone 0 (step 654) and stores that number in half zone shift register 704 (step 656). In step 658, the data in half zone shift register 704 is shifted into half zone shift register 706. In step 660, accumulator 700 determines the number of error bits in the next half (which in this iteration is the second half zone of zone 0) and stores that number in half zone shift register 704 (step 662). In step 664, addition circuit 708 calculates the sum of the error bits in the redundant memory cells (RD register 702), the first half of the current zone under consideration (half zone shift register 704) and the second half of the zone under consideration (half zone shift register 706).

In step 666, it is determined whether the sum calculated in step 664 is less than the "limit" value stored in register 712. In one embodiment, each zone uses the same "limit" value. In other embodiments, different zones could use different "limit" values. Step 666 is performed by comparison circuit 710. The output of comparison circuit 710 is used by state machine 222 to decide how to proceed with the process of FIG. 14. If the sum calculated in step 664 is not less than the limit value stored in register 712, then the process of FIG. 14 can stop because at least one zone has a number of error bits greater than or equal to the limit (step 668). In other embodiments, the system can continue to count error bits for all zones even if it is found that one zone is above the limit. If, in step 666, it is determined that the sum calculated in step 664 is less than the limit value stored in register 712, then in step 670 it is determined whether there are more half zones to consider. If the system just considered the second half of zone 1, then there are more half zones to consider. If there are more half zones to consider, then the process loops back to step 658, shifts the data, and determines the error bits for the next half zone. Thus, the loop of steps 658-670 is performed for each zone. After all of the half zones have been considered (step 672), the state machine concludes that all zones have a number of error bits less than the limit in step 672. Note that in some embodiments, the second half of zone 16 is considered as part of step 650 so that the last half zone that needs to be considered (step 670) is the first half of zone 16. In other embodiment, the second half of zone 16 (not counting the redundant bits) can be the last half zone to consider. In yet another embodiment, the system can be implemented without redundant bits.

Figure 16A:
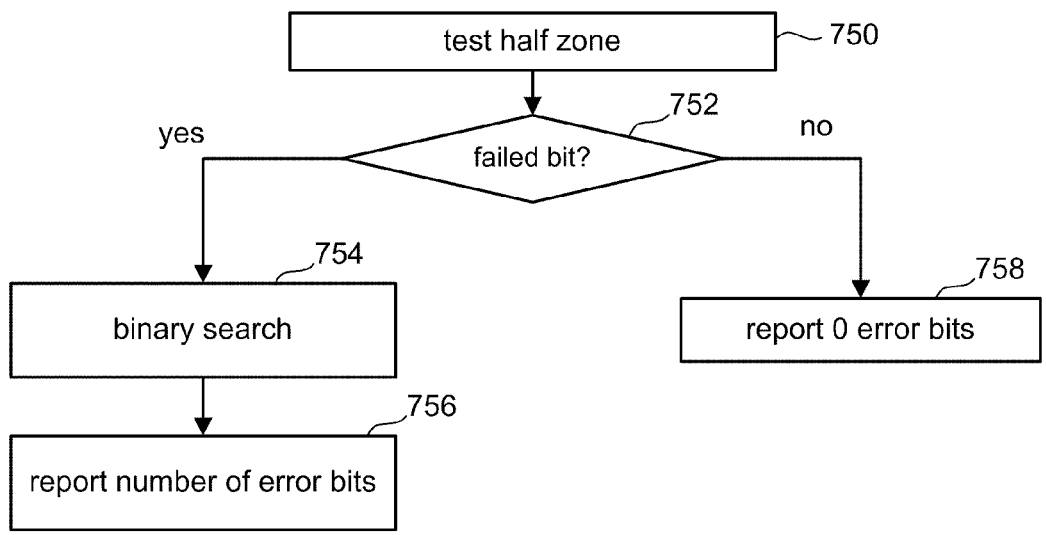
FIGS. 16A and B are flow charts describing one embodiment of a process for determining the number of error bits.

FIG. 16A is a flow chart describing one embodiment of a process for determining the number of error bits in a half zone. This process can be used to implement steps 650, 654, and 660 of FIG. 14. In step 750, all of the memory cells in the half zone under consideration are tested to determine whether they are error bits. In one embodiment, the verification process has already been performed by the respective sense circuitry 470 and the results stored in the respective data latches 494. Step 750 includes the respective processors 492 reporting whether the associated data bits have been verified to have reached their target threshold voltages. In one embodiment, all of the processors are connected to one flag line using wired-or technology so that the flag line gets pulled down if any one processor signals an error bit. If there are no error bits (step 752), then the process is complete and reports no error bits in step 758. If there are error bits (step 752), then the system will perform a binary search process in step 754 and report the number of error bits found in step 756.

Figure 16B:
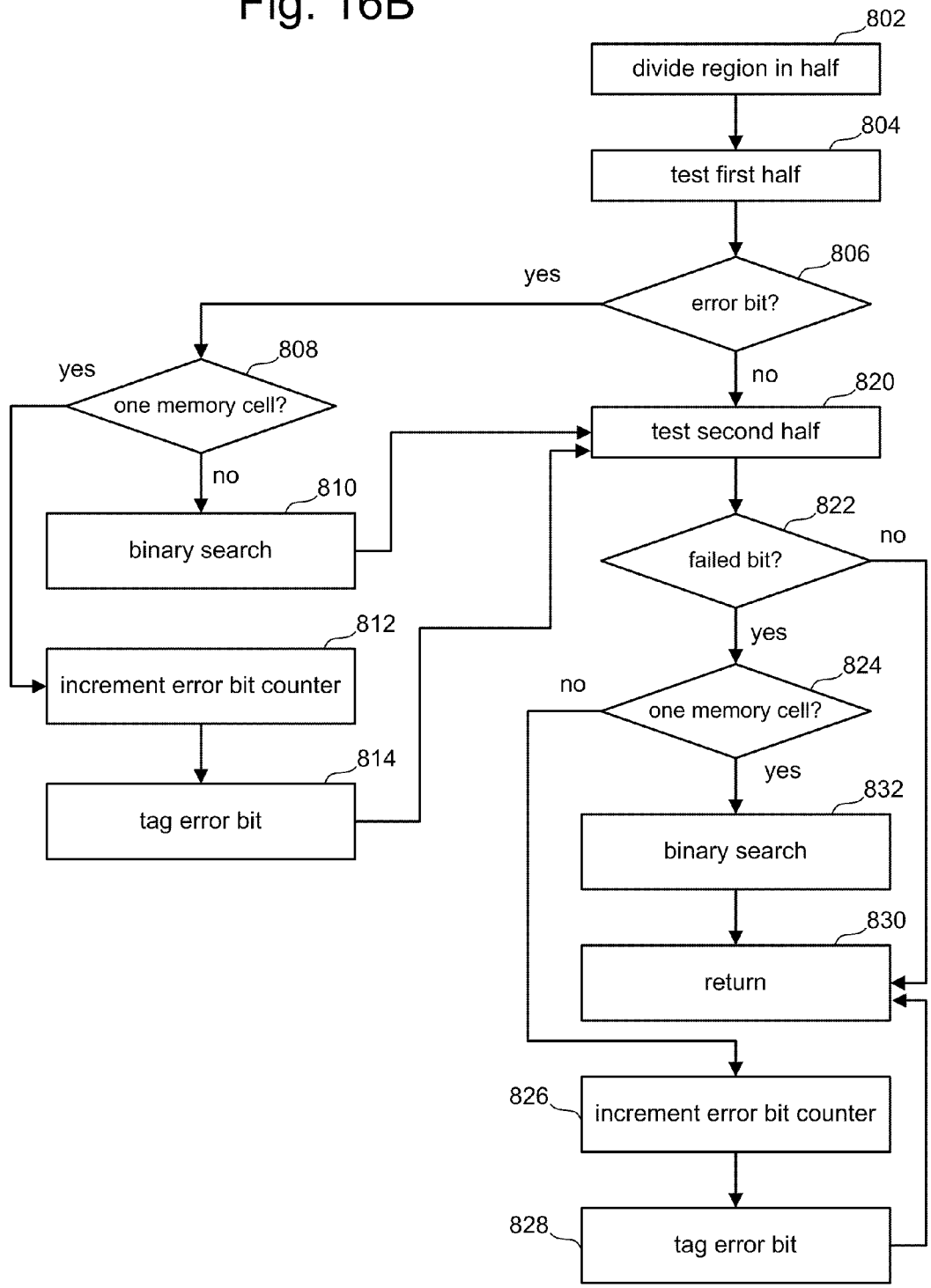

FIG. 16B is a flow chart describing one embodiment of the binary search process (see step 756). In step 802, the region under consideration is divided into two halves. The first time the process of FIG. 16B is called in response to step 754 of FIG. 16A, the region under consideration may be a half zone. Subsequent times the process of FIG. 16B is called (see below with respect to step 810 and 826), the region under consideration is a portion of a half zone. In step 804, the first half of the divided region is tested, similar to step 750 of FIG. 16A. In step 806, it is determined whether there are any error bits in the first half of the divided region tested in step 804. If there are error bits and the first half of the divided region tested in step 804 is not a single memory cell (step 808), then binary search process of FIG. 16B is recursively performed in step 810. That is, step 810 includes recursively calling the process of FIG. 16B so that step 802 is next performed in order to divide the current region in half and operate on that region as described by FIG. 16B. Thus, performing step 810 includes performing step 802 on the region under consideration and then continuing with steps 804 and the other steps of FIG. 16B. If the first half of the divided region tested in step 804 is a single memory cell (step 808), then an error bit counter (e.g., counter circuit with a register or latch—such as accumulator 700) is incremented in step 812 and the memory cell is tagged in step 814 to prevent that memory cell from being reported in subsequent iterations of the recursive process of FIG. 16B as part of step 754 of FIG. 16. For example, the respective data latch 494 for the memory cell may be flipped to indicate that it is not an error bit, another latch for the appropriate processor 492 can be set to prevent the processor 492 from reporting an error for that memory cell, or another means can be used.

If, in step 806, it is determined that there were no error bits for the first half of the region, then the second half is tested in step 820. Additionally, after steps 810 and 814, the process loops to step 820 to test the second half of the region under consideration. The testing in step 820 is performed in a similar manner as the testing in step 804, but on a different half of the region under consideration. If there are any failed bits in the second half of the region under consideration and the second half of the region under consideration is a single memory cell (step 824), then the error bit counter is incremented in step 826, the memory cell is tagged in step 828 to prevent that memory cell from being reported in subsequent iterations of the recursive process of FIG. 16B as part of step 754 of FIG. 16, and the process returns to the previous level of recursion (step 830). If there are error bits and the second half of the divided region tested in step 820 is not a single memory cell (step 824), then binary search process of FIG. 16B is recursively performed in step 832. When the process comes back from step 832, the process returns to the previous level of recursion (step 830).

In summary, the binary search process recursively calls itself, and continues to test and divide until an error bit is found, then the binary search goes back up to an appropriate level of recursion and continues to test and divide until another error bit is found. At any level of recursion, if a test finds that the region has an error bit then the region is divided and searched. If a test finds that a region does not have an error bit then the region is not divided and searched. At the end of the process, accumulator 700 will store the number of error bits in the half zone.

In one embodiment, there is one flag line for all processors 492. In another embodiment, the various processors 492 can be grouped into units of 8 processors that are connected to a flag bus that is eight bits wide. Accumulator 700 can be connected to the flag bus and add together the number of lines in the flag bus that indicate an error.

Some embodiments that uses one flag line or a multi-line flag bus connects each processor 492 to eight sense modules 480. Thus, each processor 492 reports for eight bits of data. In one example implementation, the process of FIG. 16A can be performed eight times for each half zone, with each of the performances of the process of FIG. 16A being for one of the eight bits associated with the processors 492. Accumulator 700 will accumulate the results for all eight performances of the process of FIG. 16A.

Figure 17:
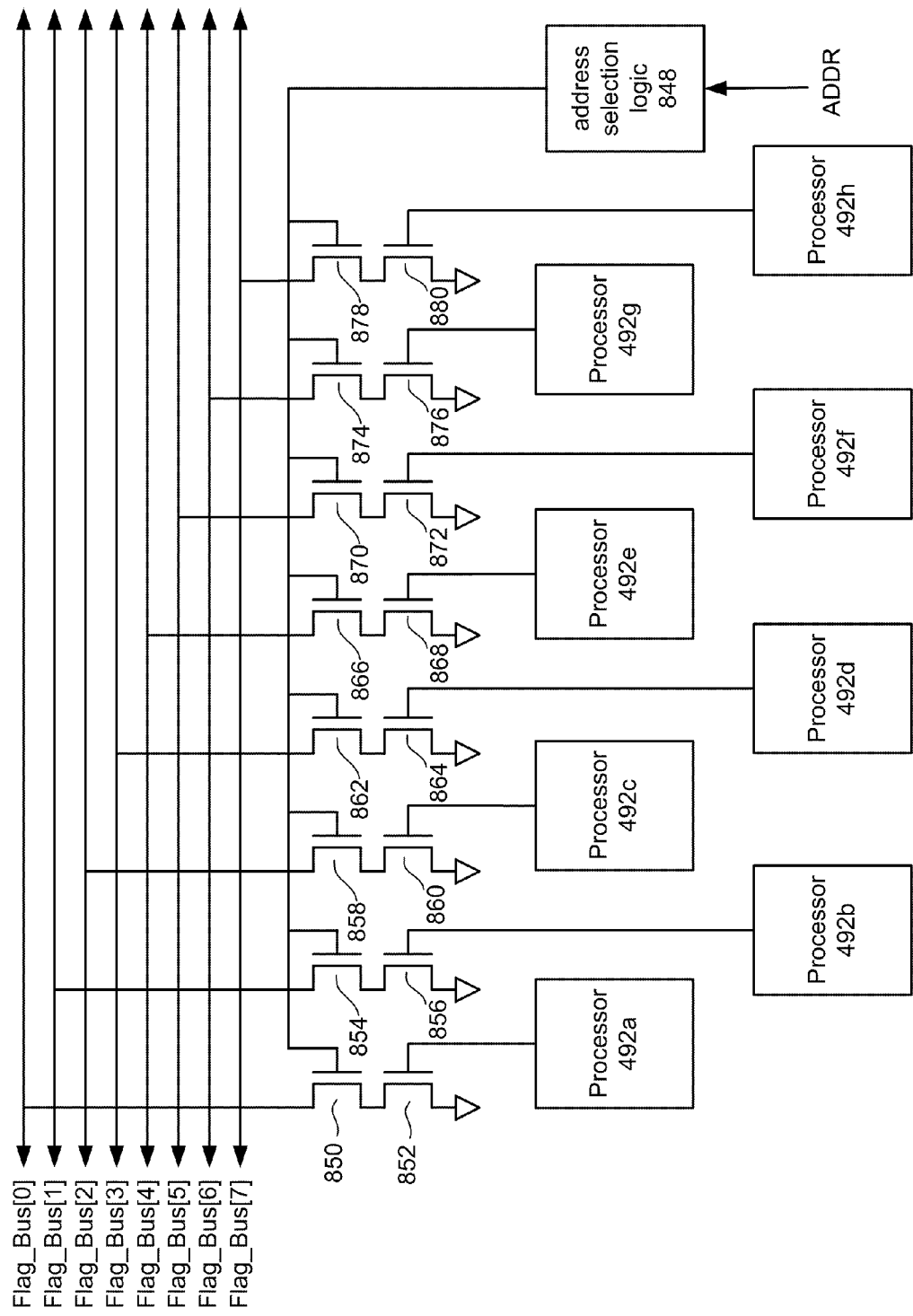
FIG. 17 is a block diagram depicting a circuit for reporting errors.

FIG. 17 is a block diagram depicting one embodiment of how processors 492 report error bits to state machine 222. The embodiment of FIG. 17 assumes the various processors 492 are grouped into units of 8 processors (492a, 492b, 492c, 492d, 492e, 492f, 492g, 492h) that are connected to an eight bit flag bus (Flag_Bus[0:7]). The processors can each be connected to one bit of data, eight bits of data or another amount of data. The group of eight processors is associated with address selection logic 848 that receives an address bus ADDR from state machine 222. In one embodiment depicted in FIG. 17, the address bus ADDR is able to individually address each group of eight processors 492. In another embodiment, the address bus ADDR is able to individually address each processor 492 of the entire system.

Processor 492a is connected to Flag_Bus[0] via transistors 850 and 852. Processor 492b is connected to Flag_Bus[1] via transistors 854 and 856. Processor 492c is connected to Flag_Bus[2] via transistors 858 and 860. Processor 492d is connected to Flag_Bus[3] via transistors 862 and 864. Processor 492e is connected to Flag_Bus[4] via transistors 866 and 868. Processor 492f is connected to Flag_Bus[5] via transistors 870 and 872. Processor 492g is connected to Flag_Bus[6] via transistors 874 and 876. Processor 492h is connected to Flag_Bus[7] via transistors 878 and 880.

Processor 492a will turn on transistor 852 to pull down Flag_Bus[0] if the associated memory cell is an error bit. Other processors (form other groups of eight processors) will also be connected to Flag_Bus[0] so that is any one of them has an error bit, Flag_Bus[0] will be pulled down. Processor 492b will turn on transistor 856 to pull down Flag_Bus[1] if the associated memory cell is an error bit. Processor 492c will turn on transistor 860 to pull down Flag_Bus[2] if the associated memory cell is an error bit. Processor 492d will turn on transistor 864 to pull down Flag_Bus[3] if the associated memory cell is an error bit. Processor 492e will turn on transistor 868 to pull down Flag_Bus[4] if the associated memory cell is an error bit. Processor 492f will turn on transistor 872 to pull down Flag_Bus[5] if the associated memory cell is an error bit. Processor 492g will turn on transistor 876 to pull down Flag_Bus[6] if the associated memory cell is an error bit. Processor 492h will turn on transistor 880 to pull down Flag_Bus[7] if the associated memory cell is an error bit.

Address selection logic 848 is connected to transistors 850, 854, 858, 862, 866, 870, 874 and 878. If the state machine is testing the data associated with the group of eight processors (492a, 492b, 492c, 492d, 492e, 492f, 492g, 492h) depicted in FIG. 17, then address selection logic 848 will turn on transistors 850, 854, 858, 862, 866, 870, 874 and 878. Address selection logic includes a circuit (e.g., combinational logic or other circuits) that receive the address bus ADDR and outputs a signal if the correct address is on the address bus ADDR. In one embodiment, the address bus ADDR includes a set of address lines (e.g., ADDR[0:12]) and a set of compliment address lines (ADDR'[0:12]). The compliment address lines (ADDR'[0:12]) can be separately asserted so that they need not always be the inverse of ADDR[0:12]. Address selection logic 848 can connect to the appropriate lines of ADDR[0:12] and the appropriate lines of ADDR'[0:12], and send that data to a set of AND gates (or other logic or other circuit elements) that will recognize when the group of eight processors (492a, 492b, 492c, 492d, 492e, 492f, 492g, 492h) are selected. With this scheme, one group of eight processors can be selected or multiple groups of eight processors can be selected.

The testing of whether there is a failed bit (see steps 750, 804, and 820) is performed by the relevant processors (of processors 492a, 492b, 492c, 492d, 492e, 492f, 492g, 492h for each group) turning on their respective transistors (of transistors 850, 854, 858, 862, 866, 870, 874, 878 for each group) to pull down the appropriate lines of the Flag_Bus[ ], and the sensing of the pulled down line by accumulator 700 (or another circuit in state machine 222). The addressing of the appropriate portions of the half zones during the binary search process is performed by asserting the appropriate lines of the address bus ADDR.

Figure 18:
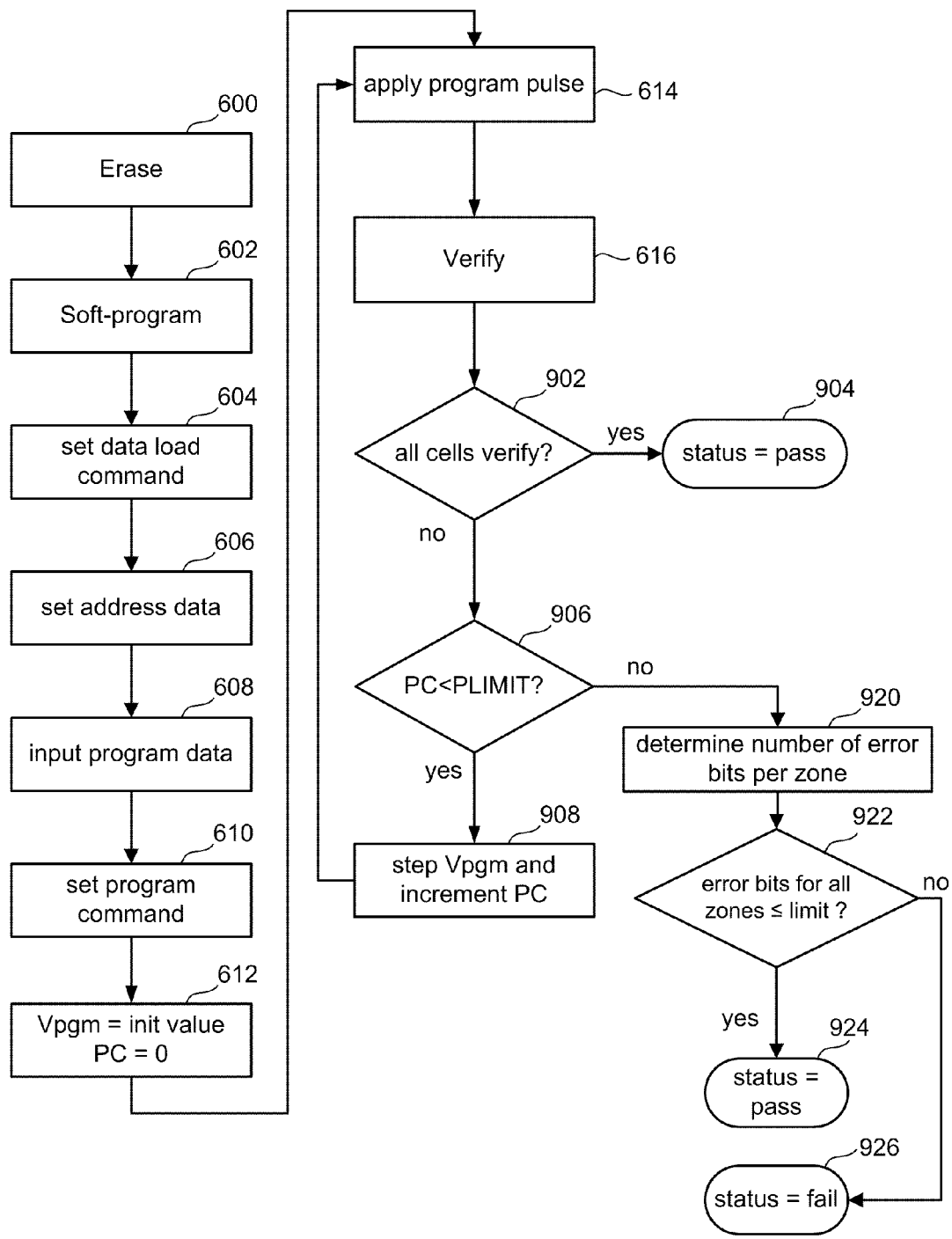
FIG. 18 is a flow chart describing one embodiment of a process for programming non-volatile memory.

FIG. 18 is a flow chart describing an alternative embodiment to that of FIG. 10 of a process for programming memory cells connected to a selected word line. Steps 600-616 of FIG. 18 are the same as in FIG. 10. After the verification process of step 616 in the process of FIG. 18, state machine 222 determines in step 903 whether all memory cells have been verified to have reached their target state. If so, the programming process of FIG. 18 is complete (step 904). If, in step 902, it is determined that not all selected memory cells have reached their target state, then in step 906 the program counter PC is checked against a program limit value PLIMIT. If the program counter PC is less than the program limit value, then the magnitude of the Vpgm pulse is increased by the step size (e.g., 0.2-0.4 volt step size) and the program counter PC is incremented in step 908. After step 908, the process loops back to step 614 to apply the next Vpgm pulse. If the program counter PC is not less than the program limit value (step 906), then in step 920 the number of error bits per zone is determined (similar to step 618 of FIG. 10). In step 922, it is determined whether the number of error bits for each zone is below the allowed limit for each zone (similar to step 620 of FIG. 10). If so, the programming process is treated as having completed successfully (step 924). If not, the programming process is treated as having failed (step 926).

The technology described with respect to FIGS. 10-18 can be used with memory cells that store two bits of data in four data states store, three bits of data in eight data states, or other arrangements.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for programming non-volatile storage, comprising:
    subjecting a set of non-volatile storage elements to programming;
    determining whether a first subset of said set of non-volatile storage elements have less than a first number of non-volatile storage elements that have not been properly programmed;
    determining whether a second subset of said set of non-volatile storage elements have less than a second number of non-volatile storage elements that have not been properly programmed, said first subset overlaps with said second subset; and
    continuing to subject said set of non-volatile storage elements to programming if said first subset does not have less than said first number of non-volatile storage elements that have not been properly programmed or said second subset does not have less than said second number of non-volatile storage elements that have not been properly programmed.

2. A method according to claim 1, wherein:
    said first number is equal to said second number.

3. A method according to claim 1, further comprising:
    stopping programming of said set of non-volatile storage elements if said first subset has less than said first number of non-volatile storage elements that have not been properly programmed and said second subset has less than said second number of non-volatile storage elements that have not been properly programmed.

4. A method according to claim 1, wherein said determining whether a first subset of said set of non-volatile storage elements has less than said first number of non-volatile storage elements that have not been properly programmed comprises:
    determining a first amount of redundant non-volatile storage elements that have not been properly programmed;
    determining a second amount of original non-volatile storage elements for said first subset that have not been properly programmed; and
    computing a sum of said first amount and said second number, said continuing to subject at least a portion of said set of non-volatile storage elements to programming includes comparing said sum to said first number.

5. A method according to claim 1, wherein:
    said non-volatile storage elements store data in sectors; and
    said first subset and said second subset are bigger than one sector and span at least portions of two sectors.

6. A method according to claim 1, wherein said determining whether a first subset of said set of non-volatile storage elements have less than a first number of non-volatile storage elements that have not been properly programmed comprises:
   (a) performing a binary search on said first subset to find a first non-volatile storage element that is not properly programmed;
   (b) updating a count of non-volatile storage elements that are not properly programmed;
   (c) tagging said first non-volatile storage element so that it will not be counted again;
   (d) repeating steps (a), (b) and (c) to determine how many non-volatile storage elements are not properly programmed.

* * * * *